(12) United States Patent
Yu et al.

(10) Patent No.: US 6,291,332 B1
(45) Date of Patent: Sep. 18, 2001

(54) ELECTROLESS PLATED SEMICONDUCTOR VIAS AND CHANNELS

(75) Inventors: Allen S. Yu, Fremont; Paul J. Steffan, Elk Grove, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/416,383

(22) Filed: Oct. 12, 1999

(51) Int. Cl.[7] .................................. H01L 21/4763
(52) U.S. Cl. .................... 438/618; 438/622; 438/624; 438/627
(58) Field of Search ........................ 438/618, 622, 438/623, 624, 627, 628

(56) References Cited

U.S. PATENT DOCUMENTS 4,692,349 * 9/1987 Georgiou et al. .
5,091,339 * 2/1992 Carey .

* cited by examiner

Primary Examiner—Kevin M. Picardat
Assistant Examiner—D M. Collins
(74) Attorney, Agent, or Firm—Mikio Ishimaru

(57) ABSTRACT

A method of manufacturing a semiconductor device is provided in which a semiconductor substrate with a dielectric layer has channel and via openings formed in the dielectric layer. A seed layer is formed over the dielectric layer and in the openings followed by a resist over the seed layer. The resist is then removed outside the openings. The seed layer outside the openings, which is not covered by the resist, is removed and the seed layer in the openings remains intact because of the resist in the openings. The resist inside the openings is removed and the seed layer inside the openings is electroless plated to fill the openings and form the channels and vias for interconnecting the semiconductor device.

20 Claims, 5 Drawing Sheets

ELECTROLESS PLATED SEMICONDUCTOR VIAS AND CHANNELS

TECHNICAL FIELD

The present invention relates generally to semiconductors and more specifically to electroless plating of conductors used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metallization", and is performed using a number of different photolithographic and deposition techniques.

One metallization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an adhesive layer is deposited to coat the walls of the first channel opening to ensure good adhesion and then a barrier layer to act as a barrier material to prevent diffusion of such conductive material into the oxide layer and the semiconductor devices. Depending upon the materials used, the adhesion layer may not be required so the combination of the adhesion and barrier material or the barrier material alone is collectively referred to as "barrier layer" herein. A seed layer is then deposited on the barrier layer to form a conductive material base, or "seed", for subsequent deposition of conductive material. A conductive material is then deposited in the first channel openings and subjected to a chemical-mechanical polishing process, which removes the first conductive material above the first channel oxide layer and damascenes the conductive material in the first channel openings to form the first channels.

For multiple layers of channels, another metallization process, which is called the "dual damascene" technique, is used in which the channels and vias are formed at the same time. The via formation step of the dual damascene technique in one example starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by an electroplating of the conductive material on the seed layer in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metallization process. The elimination of metal etch steps is important as the semiconductor industry moves from aluminum to other metallization materials which are very difficult to etch. Materials such as gold (Au), silver (Ag), nickel (Ni), palladium (Pd), and platinum (Pt) have been explored with copper (Cu) becoming replacement of choice due to low resistance and cost.

There are several methods for depositing copper, however, only two so far can successfully put copper into the small geometries of the channels and vias required for CVD is too expensive in terms of the specialty (copper laced) gases used to solidify copper onto the wafer in a CVD reactor. It also returns a poor yield (more reverse than forward reaction). Unlike CVD, which is single wafer process, electroplating can be done in batches so it tends to be a less costly process.

Electroplating requires a seed layer to attract copper ions to grow in a certain orientation. A favored seed technique employs global deposition or sputtering of a thin layer of copper having a (111) crystal orientation onto the entire wafer surface, including the sidewalls and bottom of the channels and vias. The entire wafer then is submerged into a bath of ionic solution laced with copper. Electrodes are attached at the edges of wafer and a small potential is applied across the wafer. Using the copper seed layer on top of the wafer as cathode the potential causes attraction of the copper ions toward the wafer. By accepting two electrons from the cathode, the copper ions become solidified and attached to the copper seed layer.

After electroplating, the wafer contains a thick layer of copper and its topography is no longer planar. For the dual damascene technique, where copper is filled onto both channels and vias, the non-planarity is even worse. An aggressive chemical-mechanical polish (CMP) is required to remove all traces of the copper from the inactive region (where there are no channels or vias). The aggressive CMP can lead to non-uniformity, micro-scratches, and dishing of the wafer. It also leads to erosion in the dense pattern regions and dishing on the wide channels. Furthermore, previous layer dishing and erosion profiles propagate to later layers further exacerbating the dishing problems. Dishing in the wide channels also reduces the cross-sectional area of the channels, which leads to high resistance. Micro-scratches may trap copper particles in between channels and thus lead to short currents.

A method for selectively depositing conductive material only in the channels and vias of a semiconductor wafer in a batch mode has long been sought but eluded those skilled in the art. As the semiconductor industry is moving from aluminum to copper and other type of materials with greater electrical conductivity and thinner channels and vias, it is becoming more pressing that a solution be found.

DISCLOSURE OF THE INVENTION

The present invention provides a method for manufacturing a semiconductor device in which a semiconductor substrate with a dielectric layer has channel openings formed in the dielectric layer. A seed layer is formed over the dielectric layer and in the openings followed by a resist over the seed layer. The resist is then removed outside the openings. The seed layer outside the openings, which is not covered by the resist, is removed and the seed layer in the openings remains intact because of the resist in the openings. The resist inside the openings is removed and the seed layer inside the openings is electroless plated in a batch mode to fill the openings and form the channels for interconnecting the semiconductor device.

The present invention further provides a method for forming conductive layers in semiconductor vias by processing a seed layer covered wafer to leave the seed layer only in the channels and vias for electroless plating on the seed layer to form the channels and vias. The process involves coating the seed layer with a resist and stripping the resist from the surfaces of the wafer to leave the resist only in the channels and vias. A reverse plating process removes the seed layer outside of the channels and vias, and the remaining resist is removed from the channels and vias. A batch mode electroless plating process is then used to fill the channels and vias.

The present invention further provides a method for manufacturing a semiconductor device in which a semiconductor substrate with a dielectric layer has channel and via openings formed in the dielectric layer. A seed layer is formed over the dielectric layer and in the openings followed by a resist over the seed layer. The resist is then removed outside the openings. The seed layer outside the openings, which is not covered by the resist, is removed and the seed layer in the openings remains intact because of the resist in the openings. The resist inside the openings is removed and the seed layer inside the openings is electroless plated to fill the openings and form the channels and vias for interconnecting the semiconductor device. The process eliminates global plating, aggressive and long chemical-mechanical polishing (CMP), which requires the use of slurry and incurs high maintenance cost.

The present invention further provides a method of manufacturing a semiconductor device in which a semiconductor substrate with a dielectric layer has channel openings formed in the dielectric layer. A seed layer is formed over the dielectric layer and in the openings followed by a resist over the seed layer. The resist is then removed outside the openings. The seed layer outside the openings, which is not covered by the resist, is removed and the seed layer in the openings remains intact because of the resist in the openings. The resist inside the openings is removed and the seed layer inside the openings is electroless plated to fill the openings and form the channels for the semiconductor device. A subsequent a dielectric layer is deposited and has channel and via openings formed in the dielectric layer which connect to the previously formed channels. A seed layer is formed over the dielectric layer and in the openings followed by a resist over the seed layer. The resist is then removed outside the openings. The seed layer outside the openings, which is not covered by the resist, is removed and the seed layer in the openings remains intact because of the resist in the openings. The resist inside the openings is removed and the seed layer inside the openings is electroless plated to fill the openings and form the channels and vias for interconnecting the semiconductor device. The process eliminates the additional time required to planarize each wafer between dielectric layers, which adds significantly to cost, and reduces the use of expensive, non-reclaimable slurry. This eliminates extra by-products which must be disposed of and which present environmental hazards.

The present invention further provides a method of manufacturing a semiconductor device in which a semiconductor substrate with an oxide layer has channel and via openings formed in the oxide layer. A copper seed layer is formed over the oxide layer and in the openings followed by a resist over the copper seed layer. The resist is then removed outside the openings. The copper seed layer outside the openings, which is not covered by the resist, is removed and the copper seed layer in the openings remain intact because of the resist in the openings. The resist inside the openings is removed and the copper seed layer inside the openings is electroless copper plated to fill the openings and form the copper channels and vias for interconnecting the semiconductor device. This process simplifies processing, eliminates steps, reduces cost and waste, eliminates post-copper CMP, and eliminates oxide buffs between dielectric layers.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
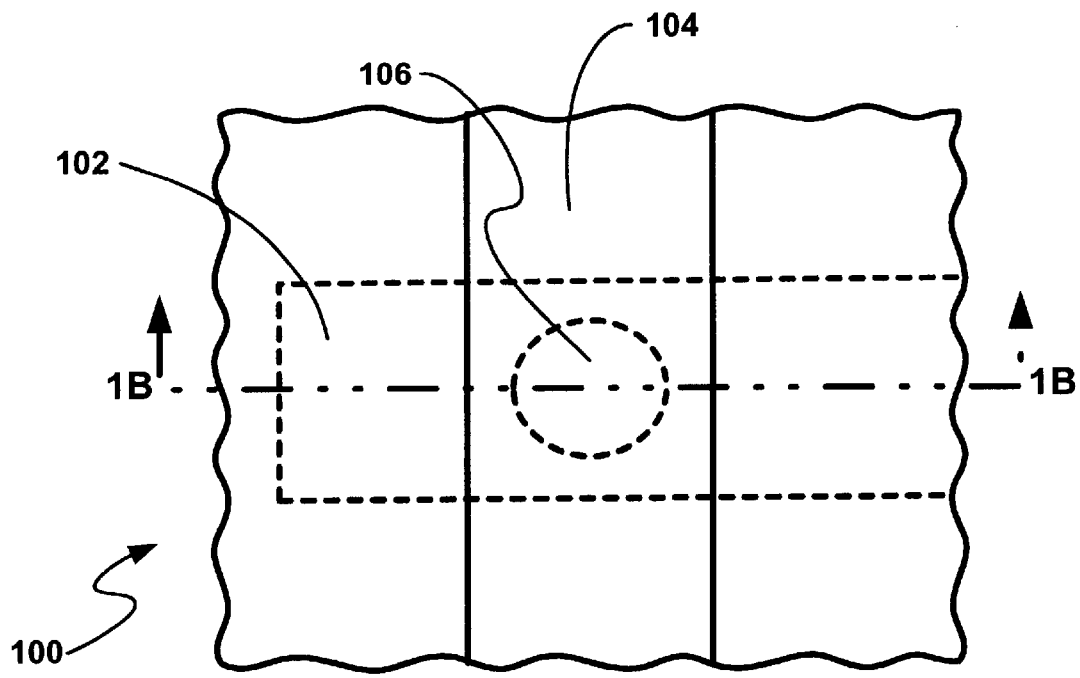
FIG. 1A (PRIOR ART) is a plan view of ideal aligned channels and a via in a semiconductor device.

Referring now to FIG. 1A (PRIOR ART), therein is shown a plan view of a prior art pair of perpendicularly aligned semiconductor channels with a connecting via disposed over a production semiconductor wafer 100. A first channel 102 is shown disposed below a second channel 104, which extends substantially perpendicular to the first channel 102 in the plan view. A round via 106 connects the first and second channels 102 and 104 and is part of the second channel 104.

Figure 1B:
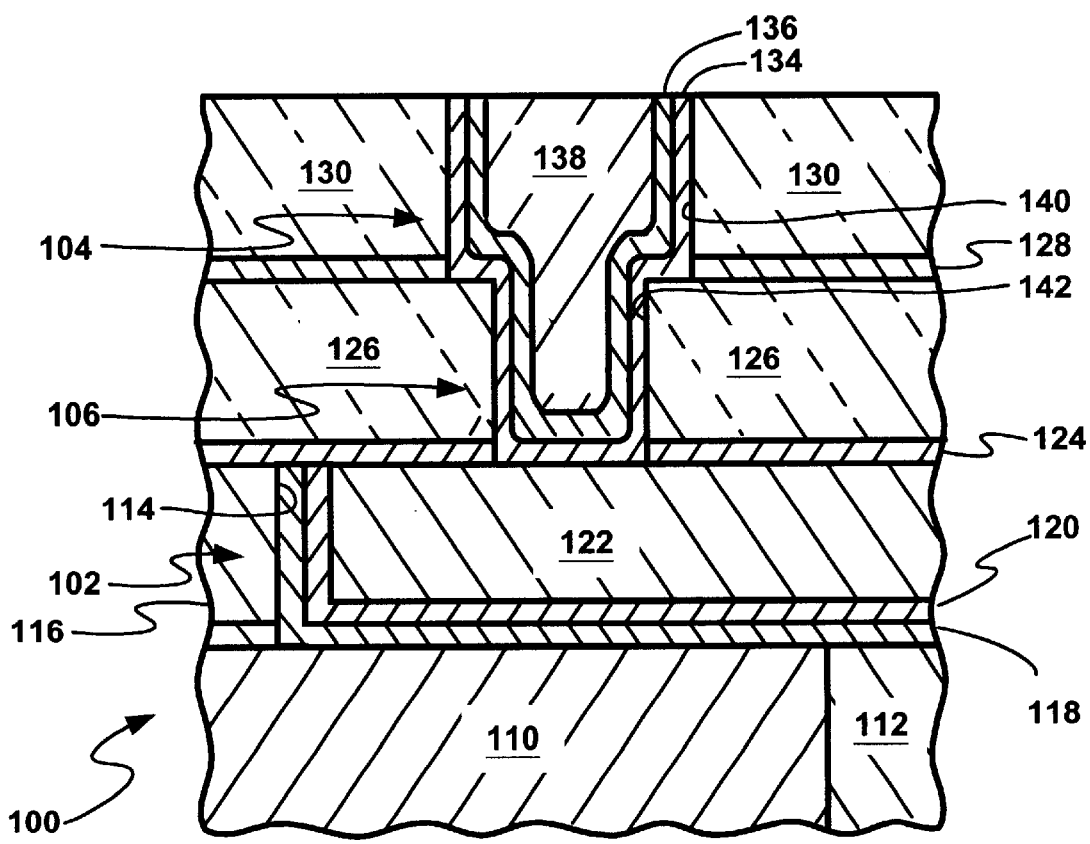
FIG. 1B (PRIOR ART) is a cross section of FIG. 1A (PRIOR ART) along line 1B—1B.

Referring now to FIG. 1B (PRIOR ART), therein is shown a cross section of FIG. 1A (PRIOR ART) along line 1B—1B. The first channel 102 is disposed over a polysilicon gate 110 and a dielectric 112 of a semiconductor device, which is part of an integrated circuit chip (not shown). The first channel 102 is disposed in a first channel opening 114 in a first dielectric layer, or first channel oxide layer 116. The first channel 102 consists of a barrier layer 118 deposited in the first channel opening 114, a seed layer 120 disposed over the barrier layer 118, and a conductive material 122 disposed over the seed layer 120.

A thin via nitride layer 124 and a via oxide layer 126 are disposed over the first channel oxide layer 116 and the first channel 102. Above the via oxide layer 126 is a second channel nitride layer 128 and a second dielectric channel layer, or second oxide layer 130. The second channel 104 and the via 106 are formed together and have a common barrier layer 134, a common seed layer 136, and common conductive material layer 138. The second channel 104 is disposed in a second channel opening 140 through the second channel oxide layer 130 and the second channel nitride layer 128. The via 106 extends into a via opening 142 in the via oxide layer 126 and the via nitride layer 124. The first channel 102 is connected by the via 106 to the second channel 104.

Figure 2A:
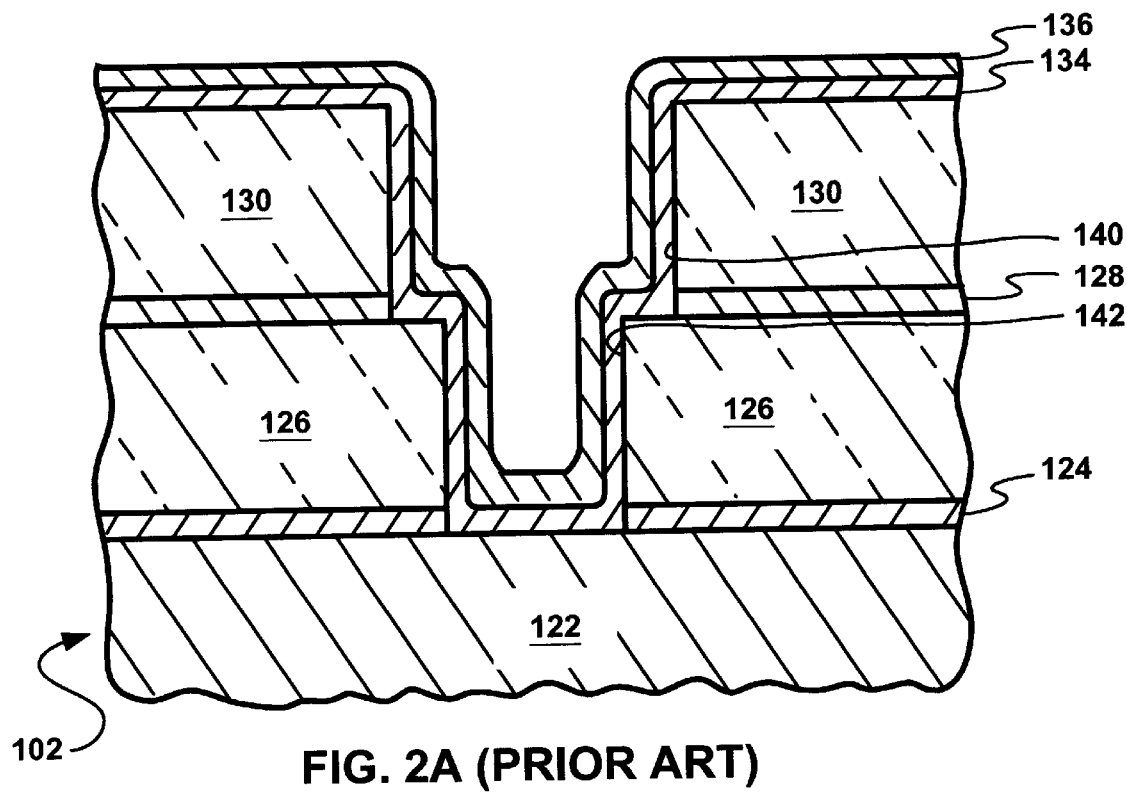
FIG. 2A (PRIOR ART) is a close-up cross section of the prior art aligned channels and via after an intermediate step of formation.

Referring now to FIG. 2A (PRIOR ART), therein is shown a close-up cross section of an intermediate step of forming the prior art aligned channels and via. The same numbers and nomenclature as used in FIGS. 1A (PRIOR ART) and 1B (PRIOR ART) are used herein. The channel 102 is formed by the same process as the second channel 104, but for ease of explanation, only the formation of the second channel 104 and the via 106 will be described. FIG. 2A (PRIOR ART) shows the deposition of the barrier layer 134 which covers the entire surface of the wafer including the via opening 142 and the second channel opening 140. The barrier layer 134 further covers the surface of the second channel oxide layer 130.

The seed layer 136 is shown deposited over the entire surface of the barrier layer 134. Both the barrier layer 134 and the seed layer 136 are deposited using conventional metal deposition techniques such as ion metal plasma (IMP) and hollow cathode barrier metallization (HCM). In these processes, the metal ions are charged and directed towards the semiconductor wafer 100 to be deposited. These techniques allow very thin metal depositions and step coverage inside the openings.

Figure 2B:
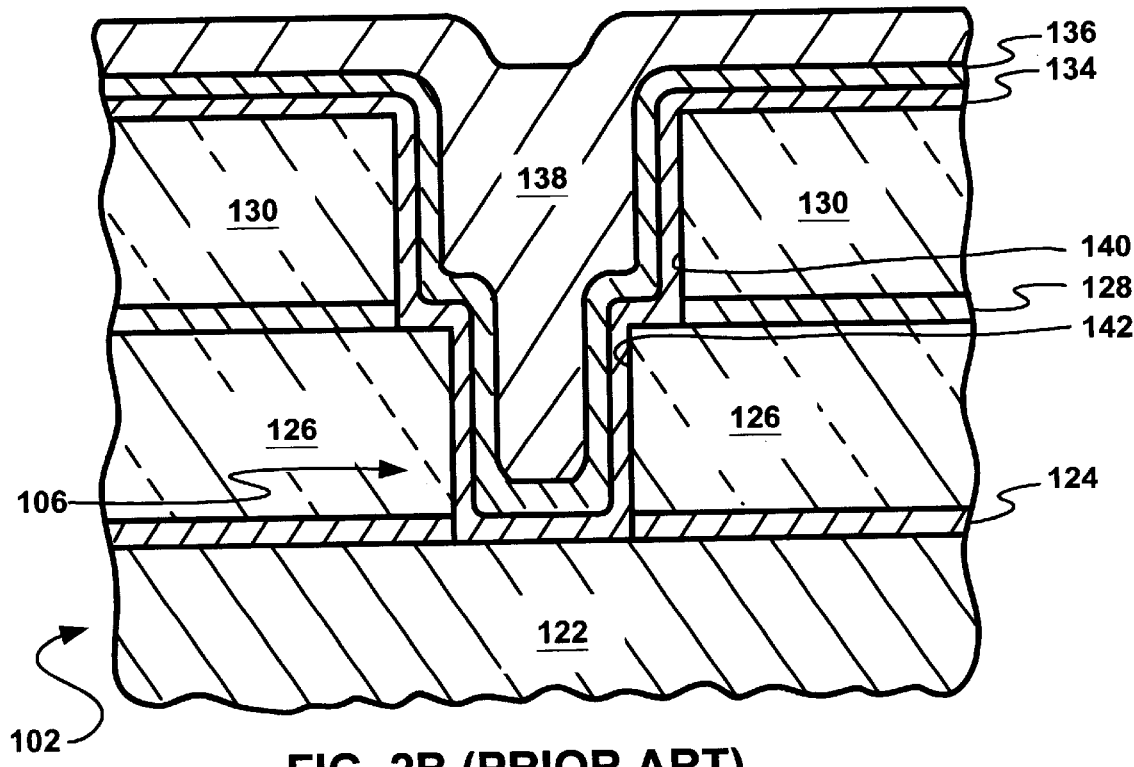
FIG. 2B (PRIOR ART) is a close-up cross section of forming the prior art aligned channels and via after a metal deposition step.

Referring now to FIG. 2B (PRIOR ART), therein is shown a close-up cross section of the metal deposition step of forming the prior art aligned channels and via. Again, the same nomenclature and numbers are used. FIG. 2B (PRIOR ART) shows the conductive material layer 138 deposited over the seed layer 136 to fill the second channel opening 140 in the via opening 142.

While this deposition process could be performed by chemical-vapor deposition (CVD) to allow for batch processing for a large number of wafers at one time, the preferred technique is electroplating. With the seed layer 136 having been deposited in the proper crystal orientation during its deposition process, a batch of wafers is submerged in a bath of ionic solution laced with ions of the conductive material. Electrodes are attached at the edges of the wafers, and a small potential is applied across the wafers. Using the sheet of the seed layer 136 as the cathodes, the potentials cause attraction of the conductive material ions to deposit on the seed layer 136. as shown in FIG. 2B (PRIOR ART).

Figure 2C:
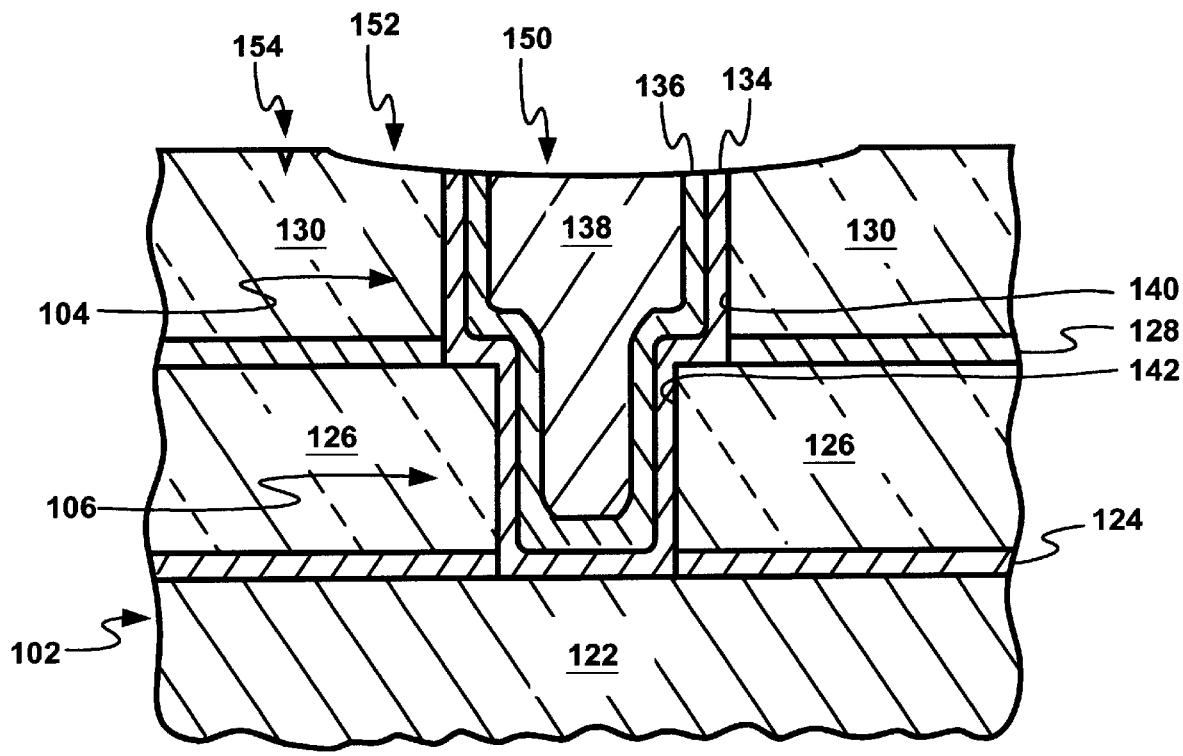
FIG. 2C (PRIOR ART) is a close-up cross section of the prior art aligned channels and via after chemical-mechanical polishing (CMP)

Referring now to FIG. 2C (PRIOR ART), therein is shown a close-up cross section of actual aligned channels and a via in a semiconductor device. Again, the nomenclature and numbers are the same as shown in FIG. 2A (PRIOR ART). In FIG. 2C (PRIOR ART), therein is shown FIG. 2B (PRIOR ART) after aggressive chemical-mechanical polishing (CMP) to damascene the conductive material layer 138, the seed layer 136, and the barrier layer 134 of the second channel 104 into the second channel oxide layer 130. As a result of the aggressive CMP, it may be seen that in an actual semiconductor device 100 dishing 150 of the channel 104, erosion 152 of the second channel oxide layer 130, and micro-scratches 154 in the second channel oxide layer 130 will occur.

The dishing 150 and the erosion 152 both propagate into upper layers further exacerbating the dishing problems. The dishing 150 also reduces the cross-sectional area of the second channel 104, which leads to high resistance. The micro-scratches 154 may trap conductive material particles and form unintended micro-channels, which can lead to short circuits between channels.

To minimize the dishing 150, erosion 152, and micro-scratches, an oxide buff is generally performed after CMP. For high volume fabrication, the additional time required to planarize each wafer individually adds significantly to cost. In addition to the extended time to planarize the wafer, large amounts of expensive slurry, which is not reclaimable, would be consumed. The waste slurry is an environmental hazard as well as being expensive to dispose of. The aggressive CMP further shortens the life of the polish pads, requires extensive use of slurry, and requires the use of high maintenance equipment.

Figure 3A:
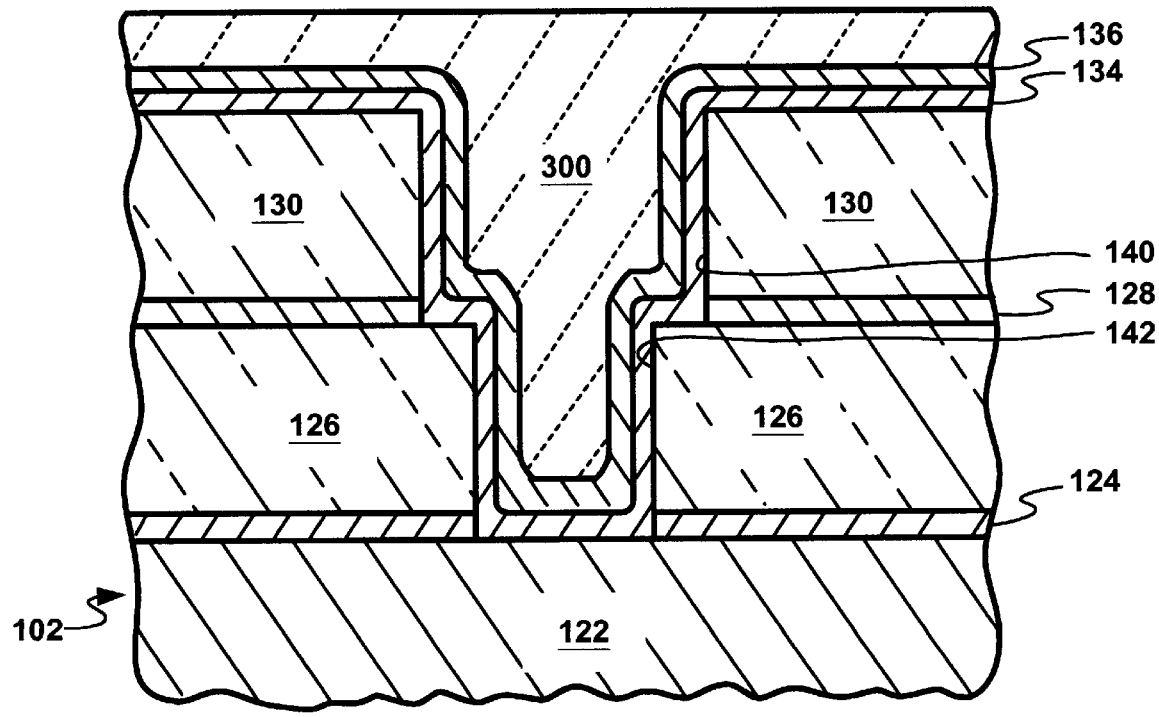
FIG. 3A is a close-up cross section of the aligned channels and via of the present invention after a resist fill step.

Referring now to FIG. 3A, therein is shown a close-up cross section of an intermediate step of forming the aligned channels and via of the present invention. The same nomenclature and numbers as in FIG. 2A (PRIOR ART) are used herein. FIG. 3A shows the structure of FIG. 2A (PRIOR ART) filled with a resist 300. The resist 300 may be a standard photoresist or a low-cost non-photosensitive resist. The resist 300 completely coats the seed layer 136.

Figure 3B:
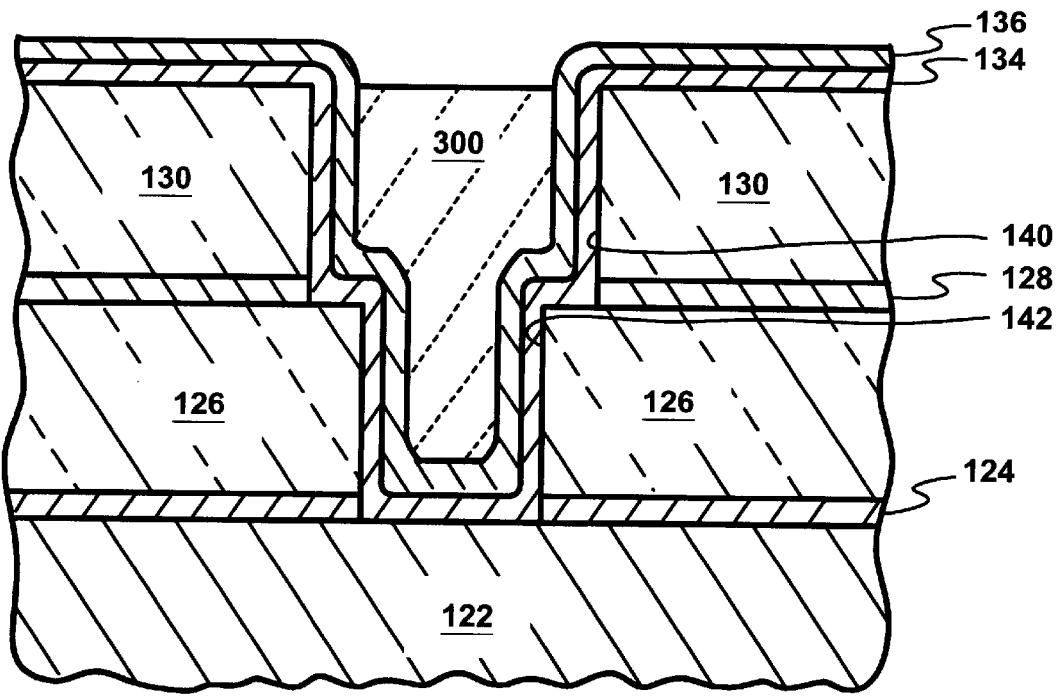
FIG. 3B is a close-up cross section of the aligned channels and via of the present invention after a blanket resist strip step.

Referring now to FIG. 3B, therein is shown a close-up cross section of a partial resist strip step of forming the aligned channels and via of the present invention. Again, the nomenclature and numbers are the same as in FIG. 2A (PRIOR ART). In FIG. 3B the resist 300 has been subject to a blanket strip back that is used to reduce the coverage of the resist 300 to expose the seed layer 136 on the inactive regions.

Figure 3C:
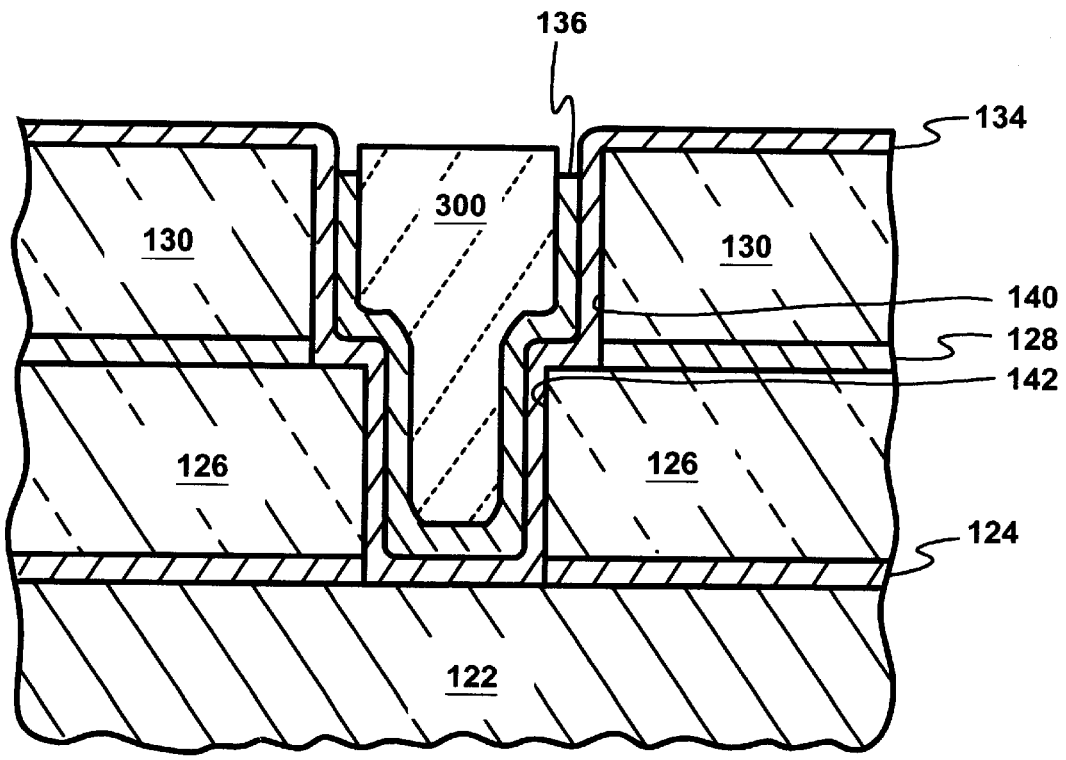
FIG. 3C is a close-up cross section of the aligned channels and via of the present invention after a metal fill step.

Referring now to FIG. 3C, therein is shown a close-up cross section of a seed layer removal step of forming the aligned channels and via of the present invention. Different types of removal processes can be used to remove the seed layer 136 from the areas where the resist has been removed.

One seed layer removal technique would be that of reverse plating. For conductive materials such as copper, the reaction would be:

Oxidation (anode) of reducing agents on catalytic metal surface:

Reduction (cathode) of Cu ions on catalytic metal surface:

Because reverse plating is also a batch process, it is ideal to selectively remove the copper seed in volume.

If desired, a similar reverse plating process may also remove the barrier layer 134.

Figure 3D:
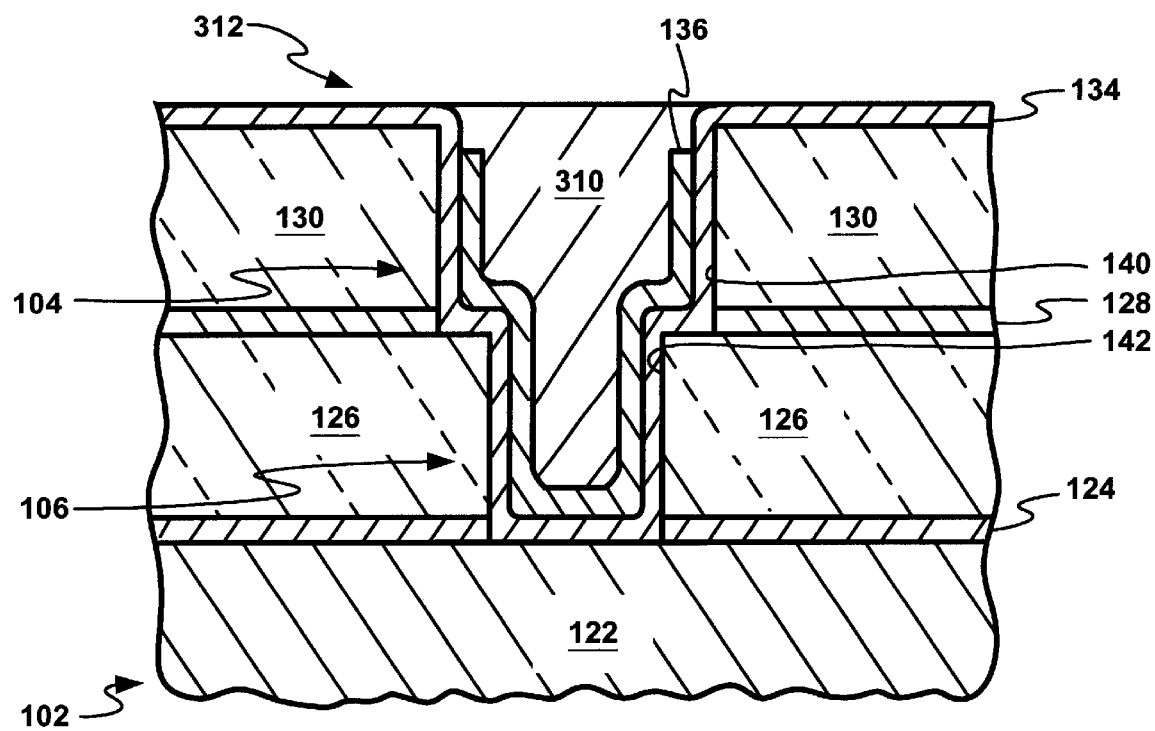
FIG. 3D is a close-up cross section of the aligned channels and via of the present invention after the metal deposition step.

Referring now to FIG. 3D, therein is shown a close-up cross section of the aligned channels and via of the present invention after removal of the resist 300 and selective electroless plating of the seed layer 136 to form the second channel 104 and the via 106.

The basic electrochemical reaction is:

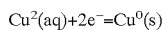

(on cathode: wafer)

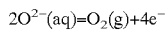

(on anode: lead, platinum, etc.)

Copper is depleted from the solution and plated at the cathode, while the anode remains intact.

A batch of wafers may be submerged in an electroless plating bath where the conductive material will only deposit on the seed layer. This is because electroless plating does not require the continuous sheet of seed layer as does electrolytic plating. By carefully controlling the rate of electroless plating, as well known to those skilled in the art, the conductive material can fill the second channel 104 level with the top of the second channel oxide layer 130 and the barrier layer 134. Since the conductive material 310 will not deposit outside of the second channel 104, a conductive material CMP is not required and can be replaced by a more cost and time-effective conductive material buff step.

Also, because the conductive material layer 310 will only deposit in the second channel 104, this technique is inherently self-aligning and conserves conductive material. Where expensive and/or exotic conductive materials are used, the selective plating technique will significantly reduce the material cost.

Thus, the present invention provides a low cost, low waste method of manufacturing semiconductor channels and vias. Essentially, processing is simplified, the steps required are reduced, CMP waste and equipment costs are eliminated, and an oxide buff is eliminated. Further, the process is basically self-aligning for the formation of the semiconductor channels and vias.

While the best mode utilizes copper as the conductive material, it should be understood that the present invention is applicable to other conductive materials in addition to copper, such as aluminum, gold, silver, nickel, palladium, platinum, an alloy thereof, and a combination thereof.

The seed layer is generally the purer form of the conductive material. The barrier layer can be alloys of tantalum, titanium, tungsten, cobalt, and compounds of these metals, generally a nitride.

Further, although the embodiments of the present invention are directed to using the dual damascene technique, it also will be recognized by those skilled in the art that other techniques of forming interconnects or other traditional techniques of forming low resistance contacts or plugs which involve filling an opening with conductive materials such as tungsten or aluminum may be used to practice the present invention. In addition, while the embodiments of the present inventions form a seed layer in a channel opening and a via atop another conductive channel, it should be understood that the present invention is applicable to forming a seed layer in a channel opening and/or a via atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:

providing a semiconductor substrate with a dielectric layer formed thereon, wherein the dielectric layer overlays a region on the semiconductor substrate;

forming an opening in the dielectric layer, the opening defined by walls of the dielectric layer;

forming a seed layer over the dielectric layer and in the opening, including along the walls, the seed layer formed to a thickness insufficient to fill the opening;

forming a resist over the seed layer, the resist formed to a thickness sufficient to fill the opening;

removing the resist outside the opening;

removing the seed layer outside the opening whereby the opening containing the resist retains the seed layer;

removing the resist inside the opening; and forming a layer of conductive material in contact with the seed layer inside the opening by electroless plating, the conductive material deposited to a thickness sufficient to fill the opening.

2. The method as claimed in claim 1 wherein the step of:

removing the seed layer uses a reverse electroless plating process.

3. The method as claimed in claim 1 wherein the step of:

forming an opening simultaneously forms a channel opening and a via opening.

4. The method as claimed in claim 1 including a step of:

forming a barrier layer in the opening before forming the seed layer.

5. The method as claimed in claim 3 including a step of:

removing the barrier layer after removing the seed layer.

6. The method as claimed in claim 4 wherein the step of:

forming the barrier layer uses a material selected from a group consisting of titanium, tantalum, cobalt, tungsten, an alloy thereof, and a compound thereof.

7. The method as claimed in claim 1 wherein the step of:

forming a seed layer uses a material selected from a group consisting of aluminum, copper, gold, silver, nickel, palladium, platinum, and an alloy thereof.

8. The method as claimed in claim 1 wherein the step of:

forming a layer of conductive material uses a material selected from a group consisting of aluminum, copper, gold, silver, nickel, palladium, platinum, and an alloy thereof.

9. The method as claimed in claim 1 wherein the step of:

providing a semiconductor substrate with a dielectric layer provides a silicon substrate with an oxide layer.

10. The method as claimed in claim 1 wherein the step of:

forming the layer of conductive material is self-aligning.

11. A method of manufacturing a semiconductor device, comprising the steps of:

providing a semiconductor substrate with a dielectric layer formed thereon, wherein the dielectric layer overlays a region on the semiconductor substrate;

forming a channel and a via opening in the dielectric layer, the opening defined by walls of the dielectric layer;

forming a seed layer over the dielectric layer and in the opening, including along the walls, the seed layer formed to a thickness insufficient to fill the opening;

forming a resist over the seed layer, the resist formed to a thickness sufficient to fill the opening;

removing the resist outside the opening;

removing the seed layer outside the opening whereby the opening containing the resist retains the seed layer;

removing the resist inside the opening; and forming a layer of conductive material in contact with the seed layer inside the opening by electroless plating, the conductive material deposited to a thickness sufficient to fill the opening.

12. The method as claimed in claim 11 wherein the step of:

removing the seed layer uses a reverse electroless plating process.

13. The method as claimed in claim 11 wherein the step of:

forming a channel and a via opening forms a connection to a conductive channel on the semiconductor substrate.

14. The method as claimed in claim 11 including a step of:

forming a barrier layer in the opening before forming the seed layer.

15. The method as claimed in claim 14 including a step of:

removing the barrier layer by a chemical-mechanical polishing process after removing the seed layer.

16. The method as claimed in claim 15 wherein the step of:

forming the barrier layer uses a material selected from a group consisting of titanium, tantalum, cobalt, tungsten, an alloy thereof, and a nitride compound thereof.

17. The method as claimed in claim 11 wherein the step of:

forming a seed layer uses a material selected from a group consisting of aluminum, copper, gold, silver, nickel, palladium, platinum, and an alloy thereof.

18. The method as claimed in claim 11 wherein the step of:

forming a layer of conductive material uses a material selected from a group consisting of aluminum, copper, gold, silver, nickel, palladium, platinum, and an alloy thereof.

19. The method as claimed in claim 11 wherein the step of:

providing a semiconductor substrate with a dielectric layer provides a silicon substrate with an oxide layer.

20. The method as claimed in claim 11 wherein the step of:

forming the layer of conductive material forms a self-aligned channel and via.

* * * * *